(12) United States Patent
Seebacher et al.

(10) Patent No.: US 12,726,020 B2
(45) Date of Patent: Sep. 1, 2026

(54) SEMICONDUCTOR DEVICE WITH INPUT PROTECTION

(71) Applicant: Infineon Technologies AG, Neubiberg (DE)

(72) Inventors: Markus Seebacher, Wernberg (AT); Herwig Wappis, Villach (AT)

(73) Assignee: Infineon Technologies AG, Neubiberg (DE)

( * ) Notice: Subject to any disclaimer, the term of this patent is extended or adjusted under 35 U.S.C. 154(b) by 139 days.

(21) Appl. No.: 18/640,068

(22) Filed: Apr. 19, 2024

(65) Prior Publication Data

US 2024/0372358 A1 Nov. 7, 2024

(30) Foreign Application Priority Data

May 4, 2023 (DE) ..................... 10 2023 204 159.6

(51) Int. Cl.
*H02H 9/04* (2006.01)
*H03K 17/687* (2006.01)
*H10D 89/60* (2025.01)

(52) U.S. Cl.
CPC ........... *H02H 9/046* (2013.01); *H03K 17/687* (2013.01); *H10D 89/921* (2025.01)

(58) Field of Classification Search
CPC ..... H02H 9/046; H03K 17/687; H10D 89/921
See application file for complete search history.

(56) References Cited

U.S. PATENT DOCUMENTS 9,793,882 B1 * 10/2017 Hsieh ...................... H03M 1/12
10,972,117 B2 4/2021 Adut et al.
2003/0071672 A1 * 4/2003 Abe .................... H03M 1/1295 327/321
2013/0335868 A1 12/2013 Lamar et al.
2014/0268449 A1 * 9/2014 Chu ....................... H02H 9/046 361/56
2015/0346274 A1 12/2015 Gorman et al.

FOREIGN PATENT DOCUMENTS

EP 2845285 A1 3/2015
EP 3790199 A1 3/2021

* cited by examiner

*Primary Examiner* — Scott Bauer
(74) *Attorney, Agent, or Firm* — Eschweiler & Potashnik, LLC

(57) ABSTRACT

A semiconductor device has an analogue-to-digital converter (ADC) driven by a plurality of analogue input channels, each having an input pad and an input node connected to the input pad. The input node is connected to an input of the ADC through a respective switch. The analogue input channels comprise a high-side clamp transistor connected between the input node and a high-side power rail, a high-side comparator to clamp the input node to a high-side clamp voltage when the voltage at the input node exceeds a high-side comparison voltage, a low-side clamp transistor connected between the input node and a low-side power rail, and a low-side comparator for turning on the low-side clamp transistor to clamp the input node to a low-side clamp voltage when the voltage at the input node falls below a low-side comparison voltage.

20 Claims, 4 Drawing Sheets

40
22
Pad
36
42
46
Voffset
Vclmp
44
48
34

40
22
Pad
36
42
46
Voffset
Vclmp
44
48
34

FIG 4

60
VDD
36
68
36
64
66
+
−
62
VSS
22
34

FIG 5

VDD
36
68
36
64
66
−
+
62
VSS
22
34

26
82
22
16
20
74
86
80

SEMICONDUCTOR DEVICE WITH INPUT PROTECTION

REFERENCE TO RELATED APPLICATIONS

This application claims priority to German Patent Application 10 2023 204 159.6, filed on May 4, 2023, the contents of which are hereby incorporated by reference in their entirety.

TECHNICAL FIELD

The present disclosure relates to a semiconductor device, and in particular non-limiting examples to protection circuits used at the inputs of devices having multiple inputs.

BACKGROUND

Semiconductor ICs typically operate with a power supply connected between a high-side voltage VDD and a low-side voltage Vss which may be ground. The high-side voltage VDD may be for example+5V, or in some modern devices even lower. An overload current can occur at an input pin, especially if the voltage at the input pin Vin is outside this range. As car battery voltages are typically much greater than 5V this can relatively easily occur in some applications, such as automotive cases.

In the case of a semiconductor device with multiple input pins, an overload current at one input pin can couple as a leakage current to an adjacent pin. In the event that the adjacent pin is used as input, this can cause problems and inaccuracy. For example, in the case of a circuit with an input analogue-to-digital converter (ADC) there may be provided a plurality of input pins which can be connected in a multiplexed way to the ADC to allow the ADC to measure the voltage input at an input pin selected by a multiplexer. In the event that there is an overload condition on one of the input pins, the input current on that pin can couple to the ADC on an adjacent pin influencing the ADC measurement and making it unreliable, even in the case that the switch between the overload input pin and the ADC is off.

To address this issue, a double transmission gate (T-gate) may be used between the input pin and the ADC. The double transmission gate consists of two T-gates in series. The node between the two T-gates is switched to the supply rail. This in principle gives a good robustness, in particular with respect to an overload due to a coupling factor. Such an overload in the negative direction may be referred to as KOVAN, an acronym based on the German abbreviation "Koppelfaktor Overload Analog Negativ", e.g., an analog coupling factor negative overload. A positive overload instead of a negative overload may be referred to as a KOVAP overload. Unfortunately, due to layout effects, a parasitic Bipolar Junction Transistor (BJT) can start to conduct during a KOVAP/N event.

SUMMARY

In an example, there may be provided a semiconductor device comprising:

- a common circuit having an input;
- a plurality of analogue input channels, each having an input pad and an input node connected to the input pad, the input node being connected to an input of the common circuit through a respective switch;

wherein the analogue input channels comprise:

- a high-side clamp transistor connected between the input node and a high-side power rail,
- a high-side comparator for turning on the high-side clamp transistor to clamp the input node to a high-side clamp voltage when a voltage at the input node exceeds a high-side comparison voltage,
- a low-side clamp transistor connected between the input node and a low-side power rail,
- a low-side comparator for turning on the low-side clamp transistor to clamp the input node to a low-side clamp voltage when the voltage at the input node falls below a low-side comparison voltage.

In an example, there may be provided a semiconductor device comprising:

- an analog input channel having an input pad,
- an input node connected to the input pad,
- an active clamp circuit connected between the input node and a power rail, the active clamp circuit comprising:
- a clamp transistor having controlled terminals and a control terminal, the controlled terminals being connected between the input node and the power rail, the clamp transistor being a MOS transistor; and
- a comparator arranged to compare the voltage at the input node with a comparison voltage, the comparator having an output connected to the control terminal of the clamp transistor to turn on the clamp transistor to apply a clamp voltage to the input node when the voltage at the input node passes the comparison voltage.

BRIEF DESCRIPTION OF THE DRAWINGS

The present disclosure is illustrated by way of example, and not by way of limitation, in the figures of the accompanying drawings in which like reference numerals refer to similar or identical elements. The elements of the drawings are not necessarily to scale relative to each other. The features of the various illustrated examples can be combined unless they exclude each other.

FIG. 4 illustrates the high-side clamp circuit of the example of FIG. 1.

FIG. 5 illustrates an alternative high-side clamp circuit.

DETAILED DESCRIPTION

Figure 1:
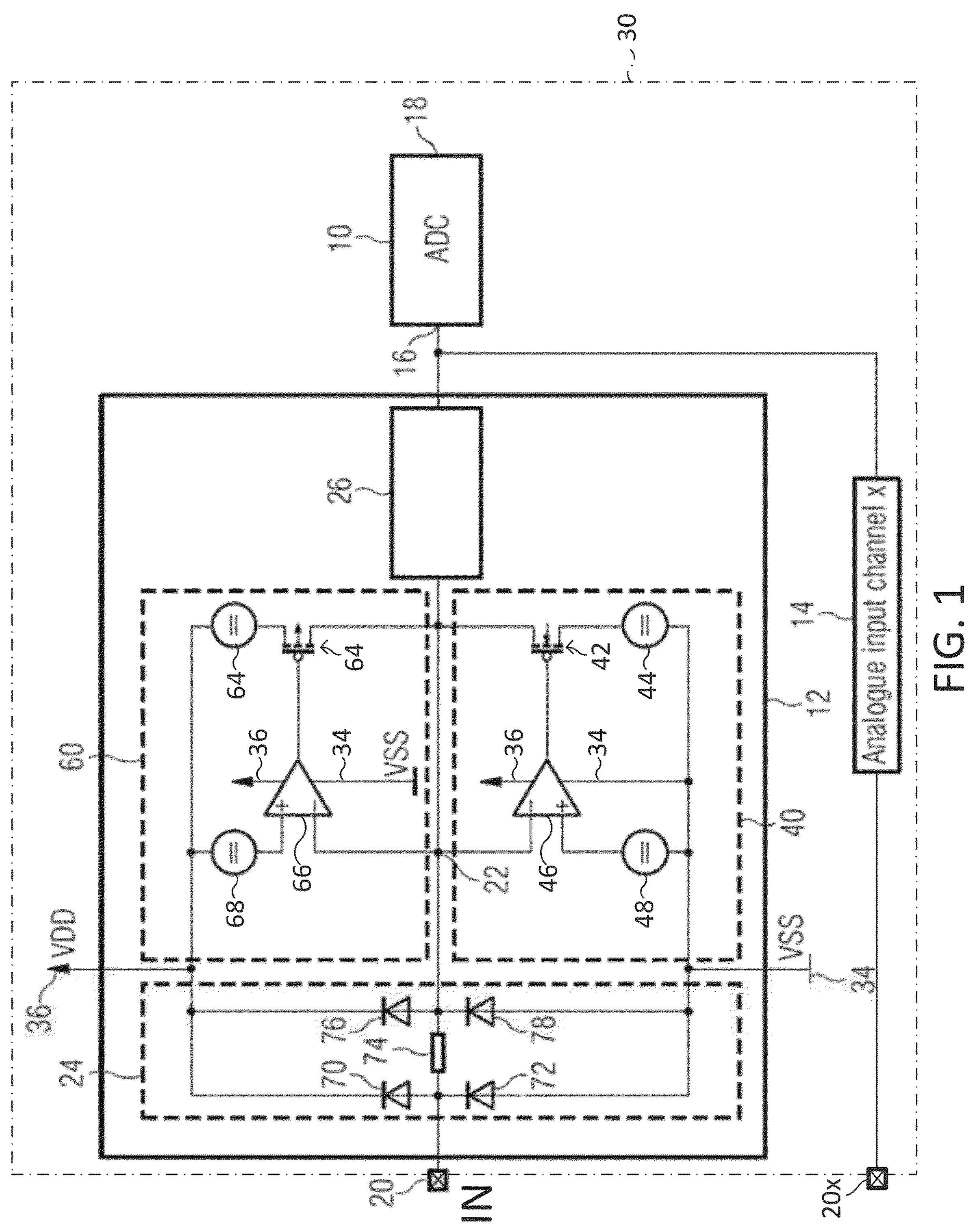
FIG. 1 illustrates a circuit according to an example.

Referring to FIG. 1, a semiconductor device has an analogue-to-digital converter (ADC) 10 and a plurality of analog input channel structures 12, 14, of which only a first analog input channel structure 12 is shown in detail. The ADC has a digital output 18 and an analog input 16, the analog input being connected to the analog input channel structures 12, 14. The circuit is connected to a high-side voltage rail 36 (e.g., VDD or positive voltage rail), as well as to a low-side voltage rail 34 (e.g., VSS or negative voltage rail), which may also be considered to be ground. In some cases, the semiconductor device manifests as an integrated circuit 30 that includes a plurality of (e.g., x) input pads (e.g., 20, . . . , and 20$x$, wherein x can be any positive integer of more than two), which may also be referred to as "pins" of the integrated circuit, and which the allow connection of the internal components of the integrated circuit 30 to other circuits or chips. In some cases, the feature of the integrated circuit 30 are formed on a single semiconductor substrate, such as a monocrystalline silicon substrate or silicon-on-insulator substrate including metal wires and vias over transistor structures, all of which are arranged with in an integrated circuit package.

Each analog channel input structure (e.g., 22) has an input pad 20, and input node 22, and an electrostatic discharge (ESD) protection structure 24 between input pad 20 and input node 22. Each analog channel input structure also includes transmission gate (e.g., 26), often referred to as a complementary metal oxide semiconductor (CMOS) T-gate, that connects the input node 22 to the analog input 16 of the ADC 10. Thus, first analog input channel structure 12 includes a first transmission gate 26, and second analog input channel structure 14 includes another instantiation of the components within the first analog input channel structure 12 and thereby includes a second transmission gate coupled between a second input pad 20*x* and ADC 10.

Figure 6:
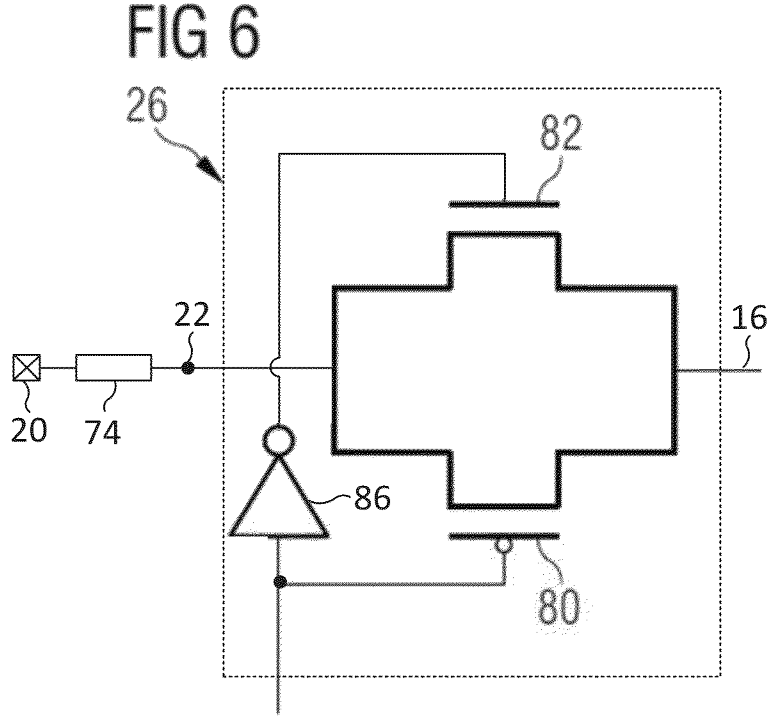
FIG. 6 illustrates a T-gate.

The T-gate 26 (FIG. 6) comprises an n-channel metal oxide semiconductor (MOS) transistor 82 and a p-channel MOS transistor 80 in parallel. By controlling the T-gates of the analog input channel structures 12, 14 it is possible to connect a desired one of the input pads 20 of a respective analog input channel structure 12, 14 to the ADC 10. The inverter 86 ensures correct driving of the two transistors 80, 82.

In the event of an overload condition of an input pad in one analog input channel structure 12, the current in that channel structure may disturb an adjoining analog input channel structure 14 even when the overloaded analog input channel structure 12 is not connected to the ADC 10, e.g., even in the case that the T-gate of the analog input channel structure 12 is switched off. This disturbs measurement on the adjoining channel. This condition is known as KOVAP in the case of a positive overload and KOVAN in the case of a negative overload. It represents an error condition in an analog mixed signal circuits in which an overload condition at one or more inputs causes interference on other input or output pins.

To address this, a low-side clamp circuit 40 and a high-side clamp circuit 60 are provided, as will now be described. The low-side clamp circuit 40 represents a KOVAN clamp and the high-side clamp circuit 60 represents a KOVAP clamp.

Figure 2:
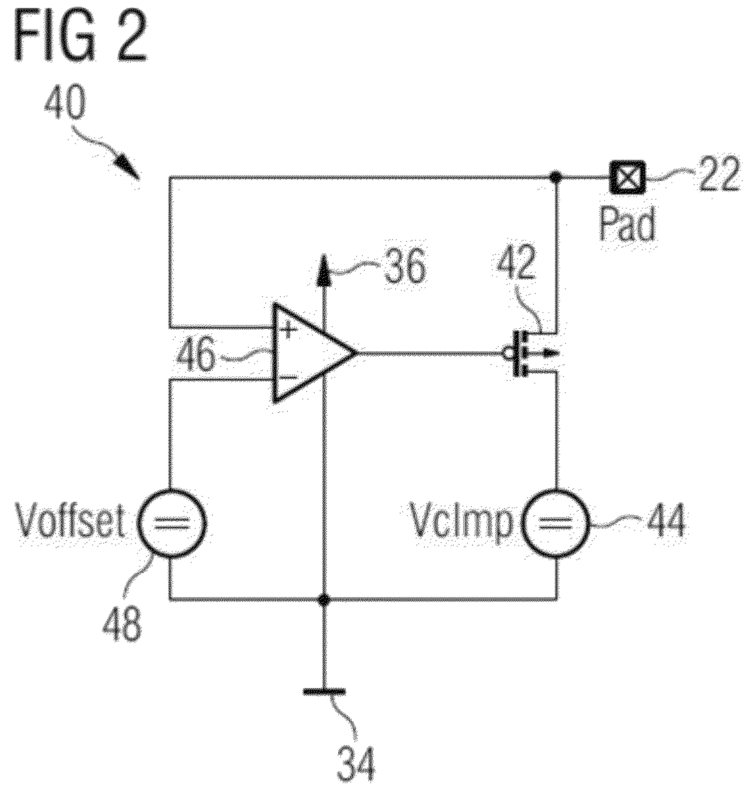
FIG. 2 illustrates the low-side clamp circuit of the example of FIG. 1.

Turning first to the low-side clamp circuit 40, with reference to FIG. 1 and FIG. 2, a low-side clamp transistor 42 in the form of an N MOSFET is connected between input node 22 and the low-side voltage rail 34. A low-side clamp voltage generator 44 is shown in the drawing provided between the low-side clamp transistor 42 and the low-side voltage rail 34. A comparator 46 has its negative input coupled to the input node 22 and the positive input coupled through a low-side offset voltage generator 48 to the ground. The low-side offset voltage generator generates a low-side comparison voltage. Note that the term "comparator" here describes the function of the comparator 46: the comparator may be a comparator, an operational amplifier or an operational transconductance amplifier.

In use, in normal operation the low-side clamp transistor is off and current is passed from the input pad 20 through the ESD protection circuit 24 to input node 22 and from there through transmission gate 26 to ADC 14.

In the case of an overload condition at input pad 20, the voltage at input node 22 sinks below VSS and the switch clamps to prevent this. The voltage at input node 22 sinks below the low-side voltage offset which causes the comparator 46 to change state. The output then controls the low-side clamp transistor 42 to be on which sinks current to the low-side voltage rail 34; the voltage at the input node is thereby clamped to be the low-side clamp voltage.

Note that in many cases the low-side comparison voltage can simply be the ground voltage 0V: in this case no components are required to generate the low-side comparison voltage. In other cases the low-side comparison voltage can be generated by low-side offset voltage generator 48 with reference to ground, as illustrated. In yet other cases the low-side offset voltage generator 48 can generate the reference voltage by comparison with the high-side power rail voltage VDD instead of ground.

In many cases, the required low-side clamp voltage may be zero, e.g., the voltage on the low-side voltage rail: in this case, the low-side clamp voltage generator 44 may be omitted.

Thus, this circuit avoids current at input of the analog input channel structure 12 affecting adjacent analog input channel structures 14 or indeed structures elsewhere on the chip.

The ESD structure 24 includes a resistor 74 provided between the input pad 20 and the input node 22. On the input pad 20 side a first pair of diodes 70, 72 are provided between the input pad 20 and the high-side and low-side voltage rails 36, 34 respectively. Similarly, on the input node side 22 a second pair of diodes 76, 78 are provided between the input node 22 and the high-side and low-side voltage rails 36, 34 respectively. Each diode includes an anode and a cathode.

The T-gate circuit 26 (FIG. 6) comprises a parallel P MOSFET 80 and N MOSFET 82 which are switched based on a common control input 84 controlling both MOSFETS 80, 82, with the control to the gate of one of the MOSFETS 80, 82 passing through an inverter. Such a T-gate circuit can be switched between off and on: the use of two MOSFETS 80, 82 ensures that it passes current for all non-overload input voltages.

Figure 3:
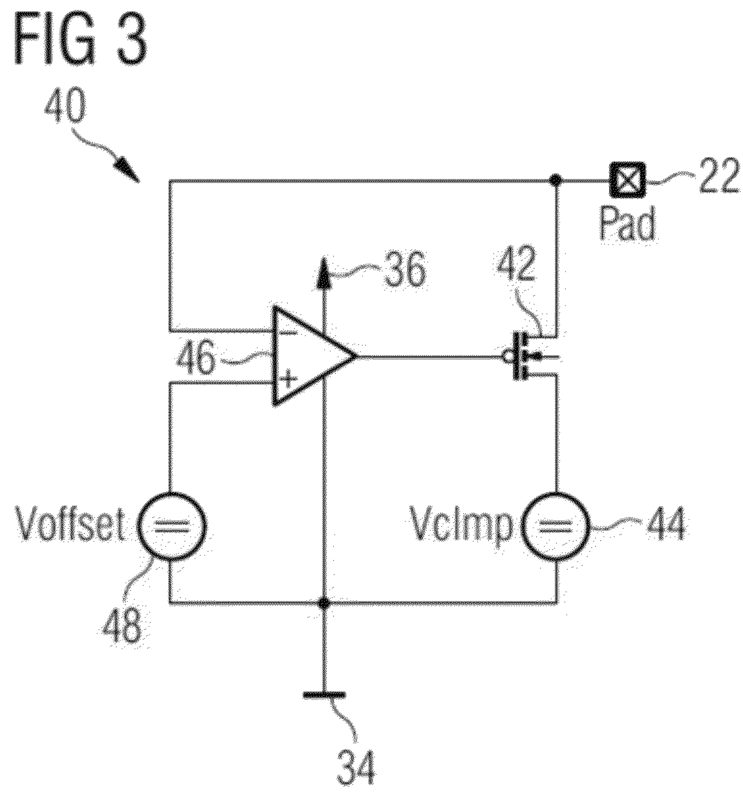
FIG. 3 illustrates an alternative low-side clamp circuit.

With reference to FIG. 3, an alternative low-side clamp circuit is presented. In this case, the low-side clamp transistor 42 is a P MOSFET and the comparator 46 has its inputs connected the other way around, e.g., with the positive input connected to the input node 22 and the negative input coupled through the low-side offset voltage generator 48 to ground. In case the required low-side comparison voltage is zero this low-side offset voltage generator 48 may be omitted.

Figures 4, 5:
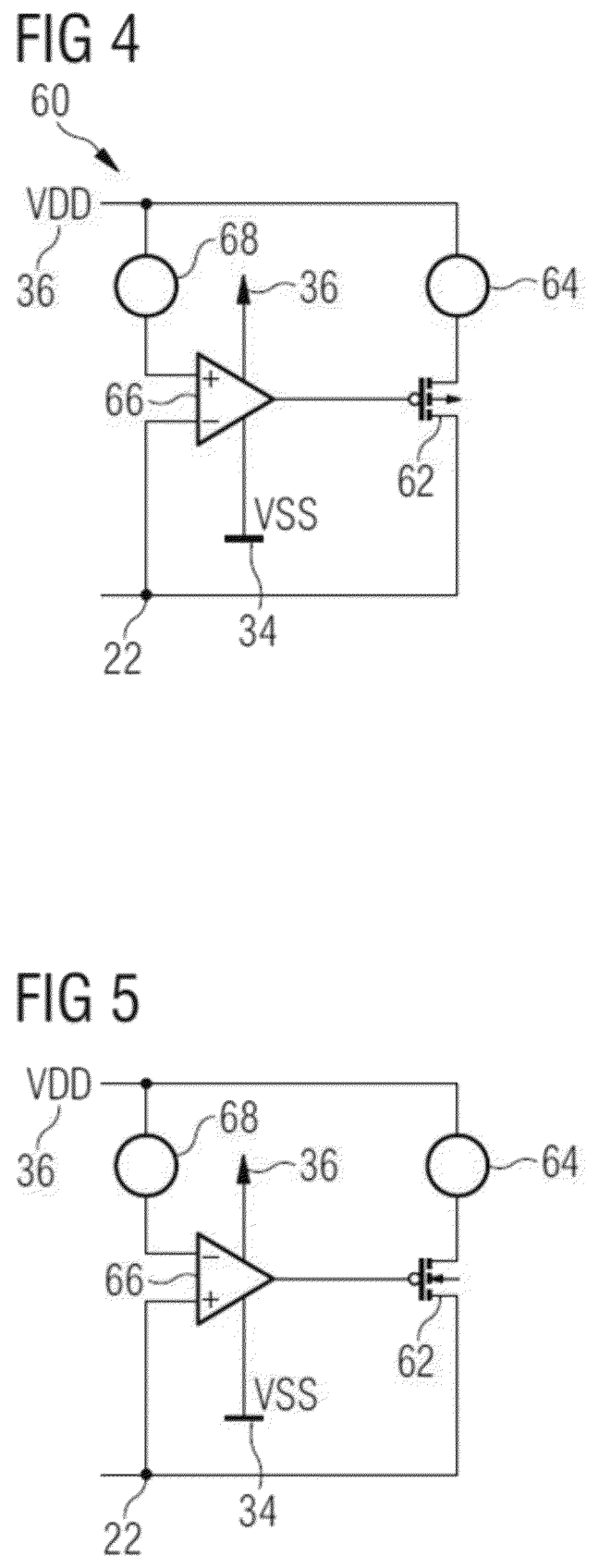

The high-side clamp circuit 60 operates similarly. With reference to FIGS. 1 and 4 a high-side clamp transistor 62 in the form of a P MOSFET is connected between input node 22 and the high-side voltage rail 36. A clamp voltage generator 64 is provided between the high-side clamp transistor 62 and the high-side voltage rail 36. An operational amplifier comparator 66 has its negative input coupled to the input node 22 coupled through a high-side offset voltage generator 68 and the positive input coupled to the high-side voltage rail. The high-side offset voltage generator 68 generates a high-side comparison voltage: in case that the high-side comparison voltage is simply the high-side rail 36 voltage the high-side offset voltage generator may be omitted.

The high-side clamp circuit 60 works in a similar way to the low-side clamp circuit 40. Normally, high-side clamp transistor 62 is controlled to be off by high-side comparator 66. In the case that the voltage of input node 22 rises above the high-side voltage offset the output of comparator 66 changes state and controls high-side clamp transistor to be on. This controls the voltage at the input node to be lower or equal to the high-side voltage offset.

With reference to FIG. 5, an alternative high-side clamp circuit is presented. In this case, the high-side clamp transistor 62 is an N MOSFET and the comparator 66 has its inputs connected the other way around, e.g., with the negative input connected to the high-side voltage rail and the positive input connected through the high-side offset voltage generator 68 to the input node 22. As above, the high-side offset voltage generator 68 may be omitted if the comparison is simply between the voltage at the input node 22 and the voltage of the high-side rail 36.

In FIGS. 1 to 5 the low-side offset voltage generator 48 and high-side offset voltage generator 68 are shown connected to one of the terminals of the comparator 46, 66. However, it will be appreciated that the offset may equivalently be introduced onto the other terminal of the comparator 46, 66. For example, instead of the arrangement shown in FIG. 5 with the high-side offset voltage generator 68 between the positive input of comparator 66 and the input node 22, the offset voltage generator 68 may instead be provided between the high-side voltage rail 36 VDD and the negative input of the comparator 66.

In many cases, the required high-side clamp voltage may be the high-side voltage rail: in this case, the high-side clamp voltage generator 64 may be omitted.

Although specific examples have been illustrated and described herein, it will be appreciated by those of ordinary skill in the art that a variety of alternate and/or equivalent implementations may be substituted for the specific examples shown and described without departing from the scope of the present invention. This application is intended to cover any adaptations or variations of the specific examples discussed herein. Therefore, it is intended that this invention be limited only by the claims and the equivalents thereof.

It should be noted that the methods and devices including its preferred embodiments as outlined in the present document may be used stand-alone or in combination with the other methods and devices disclosed in this document. In addition, the features outlined in the context of a device are also applicable to a corresponding method, and vice versa. Furthermore, all aspects of the methods and devices outlined in the present document may be arbitrarily combined. In particular, the features of the claims may be combined with one another in an arbitrary manner.

In particular, although the above description includes an ADC 10 having plural input channels, the ADC may be replaced by alternative common circuits with multiple switchable inputs, such as an Operational amplifier (op amp), an analog multiplexer, or any circuit driven with multiple selectable inputs.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiments outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A semiconductor device comprising:

a common circuit having an input;

a plurality of analogue input channels, each having an input pad and an input node connected to the input pad, the input node being connected to the input of the common circuit through a respective switch, wherein the analogue input channels comprise:

a high-side clamp transistor connected between the input node and a first power rail;

a high-side comparison voltage generator connected to a high-side comparator and the first power rail, the high-side comparator for turning on the high-side clamp transistor to clamp the input node to a high-side clamp voltage when a voltage at the input node exceeds a high-side comparison voltage from the high-side comparison voltage generator;

a low-side clamp transistor connected between the input node and a second power rail; and a low-side comparison voltage generator connected to a low-side comparator and the second power rail, the low-side comparator for turning on the low-side clamp transistor to clamp the input node to a low-side clamp voltage when the voltage at the input node falls below a low-side comparison voltage from the low-side comparison voltage generator.

2. The semiconductor device according to claim 1, wherein the common circuit is an analogue-to-digital converter (ADC).

3. The semiconductor device according to claim 1, wherein the respective switch in each of the plurality of analogue input channels is a complementary metal oxide semiconductor (CMOS) transmission gate.

4. The semiconductor device according to claim 1, further comprising:

an electrostatic discharge protection structure between the input pad and the input node.

5. The semiconductor device according to claim 1, wherein:

the high-side clamp transistor is connected to the first power rail and the high-side clamp voltage is a first power rail voltage; and the low-side clamp transistor is connected to the second power rail and the low-side clamp voltage is a second power rail voltage that is less than the first power rail voltage.

6. The semiconductor device according to claim 1, further comprising:

a high-side clamp voltage generator connected between the first power rail and the high-side clamp transistor for generating the high-side clamp voltage; and a low-side clamp voltage generator connected between the second power rail and the low-side clamp transistor.

7. The semiconductor device according to claim 1, wherein the low-side clamp transistor is an n-type metal oxide semiconductor field effect transistor (MOSFET); and the low-side comparator has its negative input terminal connected to the input node and its positive input terminal connected to the second power rail.

8. The semiconductor device according to claim 1, wherein the low-side clamp transistor is a p-type metal oxide semiconductor field effect transistor (MOSFET); and the low-side comparator has its positive input terminal connected to the input node and its negative input terminal connected to the second power rail.

9. The semiconductor device according to claim 1, wherein the high-side clamp transistor is a p-type metal oxide semiconductor field effect transistor (MOSFET); and the high-side comparator has its positive input terminal connected to the first power rail and its negative input terminal connected to the input node.

10. The semiconductor device according to claim 1, wherein the high-side clamp transistor is an n-type metal oxide semiconductor field effect transistor (MOSFET); and the high-side comparator has its negative input terminal connected to the first power rail and its positive input terminal connected to the input node.

11. A semiconductor device comprising:

an analog input channel having an input pad and an input node, an electrostatic discharge (ESD) protection structure, comprising:

a resistor with a first terminal connected to the input pad and a second terminal connected to the input node;

a first diode having an anode connected to the first terminal of the resistor; and a second diode having a cathode connected to the first terminal of the resistor;

an active clamp circuit connected between the input node and a power rail, the active clamp circuit comprising:

a clamp transistor having controlled terminals and a gate, the controlled terminals being connected between the input node and the power rail, the clamp transistor being a metal oxide semiconductor (MOS) transistor; and a comparator arranged to compare a voltage at the input node with a comparison voltage, the comparator having an output connected to the gate of the clamp transistor to turn on the clamp transistor to apply a clamp voltage to the input node when the voltage at the input node passes the comparison voltage.

12. The semiconductor device of claim 11 further comprising:

a clamp voltage generator connected between the clamp transistor and the power rail for generating the clamp voltage.

13. The semiconductor device according to claim 12 comprising:

a high-side power rail (VDD);

a low-side power rail (VSS);

wherein the active clamp circuit is a high-side active clamp circuit connected between the input node and the high-side power rail, the clamp voltage generator is a high-side clamp voltage generator, the clamp transistor is a high-side clamp transistor and the comparator is a high-side comparator having an output connected to the high-side clamp transistor to turn on the high-side clamp transistor when the voltage at the input node is greater than a high-side comparison voltage; further comprising:

a low-side active clamp circuit connected between the input node and the low-side power rail, the low-side active clamp circuit comprising:

a low-side clamp voltage generator connected to the low-side power rail for generating a low-side clamp voltage, a low-side clamp transistor having controlled terminals and a gate, the controlled terminals being connected between the input node and the low-side clamp voltage generator, and a low-side comparator arranged to compare the voltage at the input node with a low-side comparison voltage, the low-side comparator having an output connected to the gate of the low-side clamp transistor to turn on the low-side clamp transistor to apply the low-side clamp voltage to the input node when the voltage at the input node is less than the low-side comparison voltage.

14. The semiconductor device according to claim 11 further comprising an analogue-to-digital converter having an analogue input connected to the input node.

15. The semiconductor device according to claim 14 further comprising a transmission gate between the input node and the analogue-to-digital converter.

16. The semiconductor device according to claim 11, wherein the power rail is a high-side power rail (VDD) or a low-side power rail (VSS).

17. An integrated circuit, comprising:

a load circuit having an input;

a first analogue input channel having a first input pin and a first input node connected to the input of the load circuit through a first transmission gate, a second analogue input channel having a second input pin and a second input node connected to the input of the load circuit through a second transmission gate, wherein the first analogue input channel comprises:

an electrostatic discharge (ESD) protection structure coupled between the first input pin and the first input node, the ESD protection structure including: a resistor having a first terminal coupled to the first input pin and a second terminal coupled to the first input node, a first diode having an anode coupled to the first terminal of the resistor and a cathode coupled to VDD, and a second diode having an anode coupled to VSS and a cathode coupled to the first terminal of the resistor;

a high-side comparator including a first input terminal, a second input terminal, and an output terminal, the first input terminal of the high-side comparator coupled to the second terminal of the resistor, and the second input terminal of the high-side comparator coupled to VDD;

a high-side clamp transistor having a first terminal, a second terminal, and a control terminal, the control terminal of the high-side clamp transistor coupled to the output terminal of the high-side comparator, the first terminal of the high-side clamp transistor coupled to VDD, and the second terminal of the high-side clamp transistor coupled to the second terminal of the resistor and coupled to an input of the first transmission gate;

a low-side comparator including a first input terminal, a second input terminal, and an output terminal, the first input terminal of the low-side comparator coupled to the second terminal of the resistor, and the second input terminal of the low-side comparator coupled to VSS; and a low-side clamp transistor having a first terminal, a second terminal, and a control terminal, the control terminal of the low-side clamp transistor coupled to the output terminal of the low-side comparator, the first terminal of the low-side clamp transistor coupled to VSS, and the second terminal of the low-side clamp transistor coupled to the second terminal of the resistor and coupled to the input of the first transmission gate.

18. The integrated circuit of claim 17, wherein the first analogue input channel further comprises:

a high-side clamp voltage generator having a first terminal coupled to the first terminal of the high-side clamp transistor and having a second terminal coupled to VDD; and a low-side clamp voltage generator having a first terminal coupled to the first terminal of the low-side clamp transistor and having a second terminal coupled to VSS.

19. The integrated circuit of claim 17, wherein the first analogue input channel further comprises:

a high-side offset voltage generator having a first terminal coupled to VDD and a second terminal coupled to the second terminal of the high-side comparator; and a low-side offset voltage generator having a first terminal coupled to VSS and a second terminal coupled to the second terminal of the low-side comparator.

20. The integrated circuit of claim 17, wherein the load circuit comprises an ADC; and the ADC, the first analogue input channel, and the second analogue input channel are each disposed on a single monolithic silicon substrate.

* * * * *